(12) United States Patent
Kaste

(10) Patent No.: US 6,703,830 B2
(45) Date of Patent: Mar. 9, 2004

(54) TUNABLE MAGNETIC DEVICE FOR USE IN A PROXIMITY SENSOR

(75) Inventor: John M. Kaste, Fort Wayne, IN (US)

(73) Assignee: Phoenix America, Inc., Fort Wayne, IN (US)

( * ) Notice: Subject to any disclaimer, the term of this patent is extended or adjusted under 35 U.S.C. 154(b) by 0 days.

(21) Appl. No.: 10/078,905

(22) Filed: Feb. 18, 2002

(65) Prior Publication Data

US 2003/0155911 A1 Aug. 21, 2003

(51) Int. Cl.[7] .......................... G01B 7/14; G01R 35/00; H03K 17/95; H01F 7/02
(52) U.S. Cl. ............... 324/207.26; 324/202; 324/207.2; 327/116; 335/298
(58) Field of Search ............... 324/202, 207.2, 324/207.21, 207.25, 207.26, 235, 173, 174, 251, 252; 307/116, 117; 335/205, 298; 327/510, 511

(56) References Cited

U.S. PATENT DOCUMENTS

| | | | | | |
|---|---|---|---|---|---|
| 4,443,716 A | * | 4/1984 | Avery | ................. | 324/207.2 X |
| 4,524,932 A | * | 6/1985 | Bodziak | ............... | 324/207.2 X |
| 4,535,289 A | * | 8/1985 | Abe et al. | ............. | 324/207.2 X |
| 5,070,298 A | * | 12/1991 | Honda et al. | ............. | 324/207.2 |
| 5,115,194 A | | 5/1992 | Luetzow et al. | ......... | 324/207.2 |
| 5,264,792 A | | 11/1993 | Luetzow et al. | ......... | 324/207.2 |
| 5,321,355 A | | 6/1994 | Luetzow | ................. | 324/207.2 |
| 5,729,128 A | * | 3/1998 | Bunyer et al. | ............... | 324/202 |
| 5,781,005 A | * | 7/1998 | Vig et al. | ................. | 324/207.2 |
| 6,278,269 B1 | * | 8/2001 | Vig et al. | ................. | 324/207.2 |

* cited by examiner

Primary Examiner—Gerard R. Strecker
(74) Attorney, Agent, or Firm—Baker & Daniels

(57) ABSTRACT

A tunable magnetic device which includes a permanent magnet in the shape of a ring, an inner aperture, a tuning member, and a field sensor secured to the permanent magnet. The tuning member may be a ferrous or magnetic material and may be secured to a non-magnetic tuning device. The inner aperture is preferably small compared to the permanent magnet. The magnetic device provides a magnetic field that is sensitive to the proximity of a ferrous object and provides a tunable mechanism to locally balance the magnetic field where the field sensor is located.

8 Claims, 4 Drawing Sheets

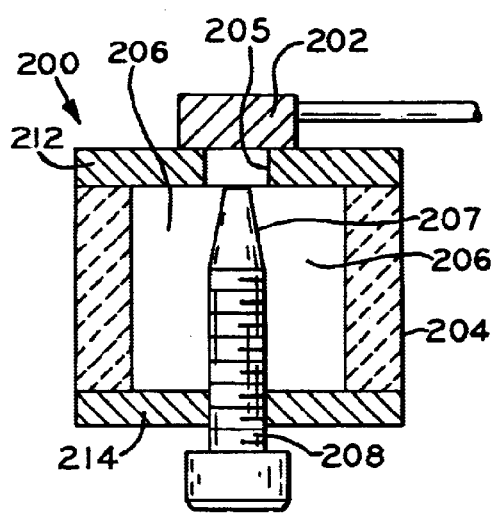 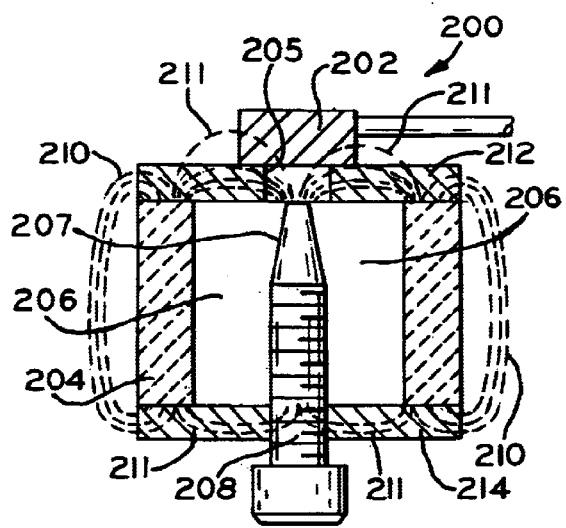
FIG_1
PRIOR ART
FIG_2
PRIOR ART

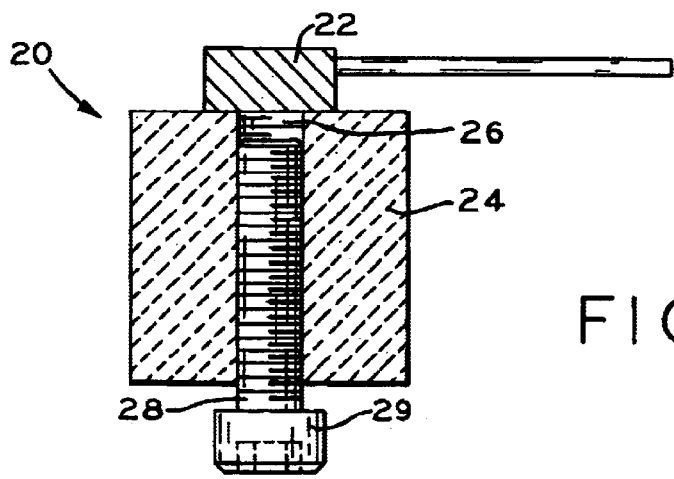
FIG_3
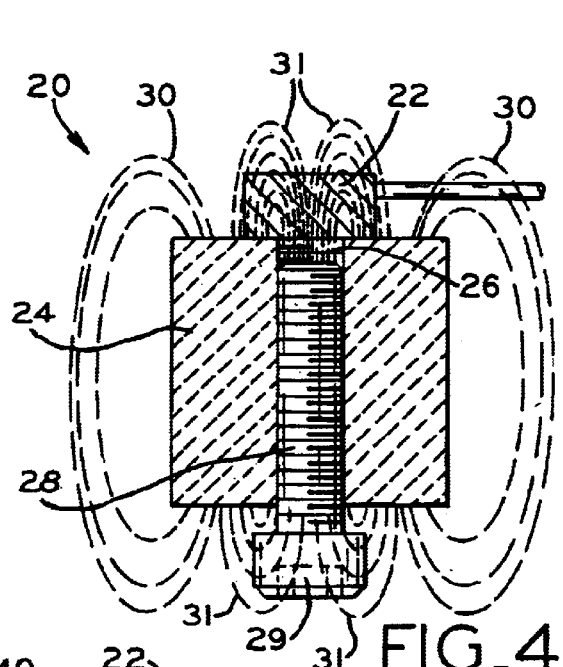
FIG_4
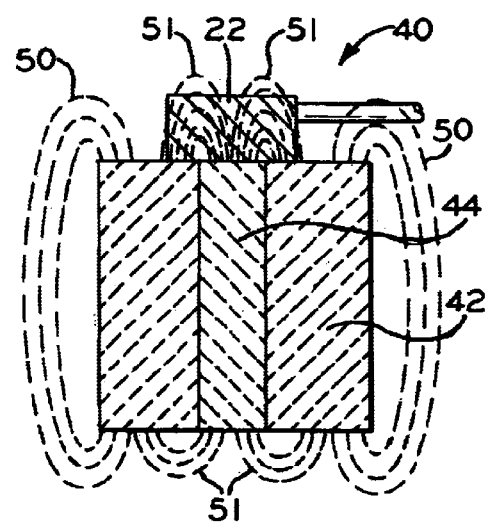
FIG_8
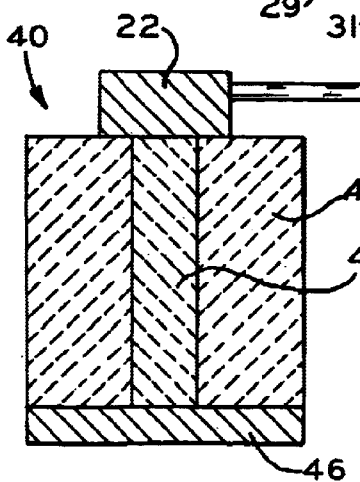
FIG_5
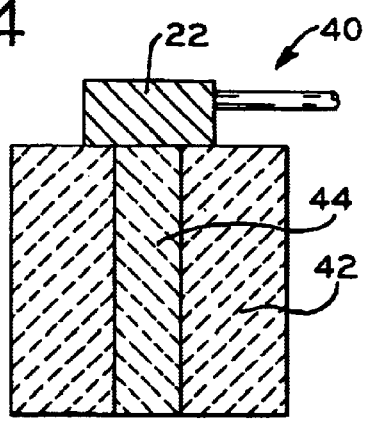
FIG_7

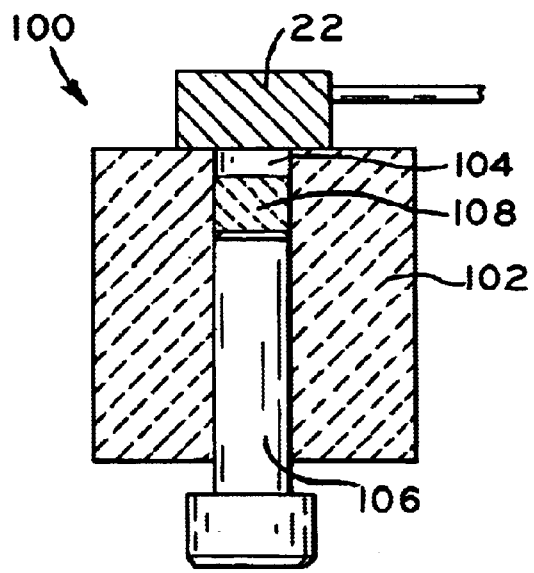
FIG_11
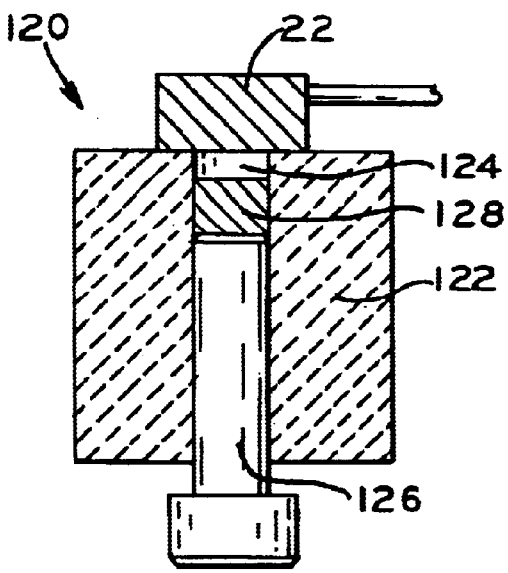
FIG_12
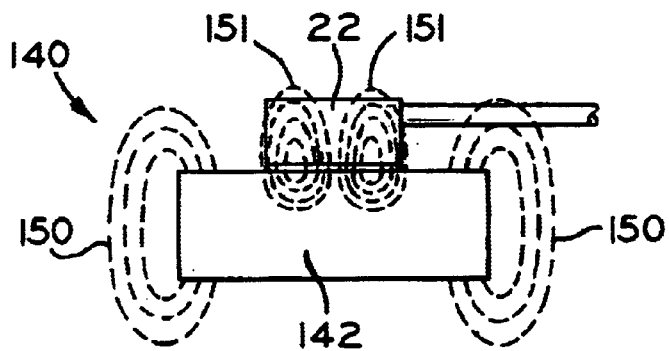
FIG_13

TUNABLE MAGNETIC DEVICE FOR USE IN A PROXIMITY SENSOR

BACKGROUND OF THE INVENTION

1. Field of the Invention

The present invention relates to proximity sensors, and, more particularly, to a tunable magnetic device for use as a proximity or position sensor.

2. Description of the Related Art

Proximity sensors are well-known devices used to detect the proximity or presence of a metallic target. The prevalent type is the "inductive" family of devices. These sensors react to electrically conductive materials such as steel, aluminum, copper, etc. by detecting "induced" eddy-currents in the target. Although this type of device can be adapted to function well in many applications, there are several fundamental problems which limit their usefulness in the manufacturing environment.

The first type of problem encountered using an inductive sensor is the difficulty in differentiating between the target and other electrically conductive materials present. An example in an automotive assembly application would be attempting to verify the presence of a steel piston ring on an aluminum piston. What is needed is a device that can easily detect the ferrous target without being confused by the electrically conductive aluminum present in the system.

The second problem associated with inductive sensors is cost and reliability. Their complex electronic circuitry uses a relatively large number of components. The high turns count, thin wire coils required present connection and packaging reliability issues, while the magnetic cores used with these coils are costly and normally in short supply. What is needed is a lower component count, lower cost circuit and a sensing element that is more durable than the prior art tiny electromagnet and core.

The third problem encountered also relates to circuit complexity. Optimum design performance is not practical when production electronic component tolerances are taken into account. This is particularly true over extended operating temperatures. As a result, the sensor's performance specifications must be de-rated or production yields must be lowered. Improvements in yield may be possible by "trimming" individual devices in the circuit but this is costly to implement. Recent development of "smart sensors" that use integrated processors present similar problems. Their self-calibrating feature does improve sensing performance and yield however unit cost and complexity in applying these sensors in a system simply transfer problems from the manufacturer to the customer. What is needed is a non-electronic trim feature that lowers production costs while providing a wider range of performance options.

The elimination of these problems together can fulfill the needs of applications that are not easily solved today. What is therefore needed is an efficient magnetic device that incorporates either a Hall effect or magnetoresistive sensor element and signal conditioning circuitry that permits the identification of ferrous materials but not non-magnetic materials that could be electrically conductive. What is further needed is a device that uses a simple and tunable magnetic circuit that will trim out manufacturing variability.

SUMMARY OF THE INVENTION

The present invention provides a permanent magnet device for use in proximity sensing applications. The device, which may be a magnetic circuit, utilizes a magnetic field sensor which has either an analog or digital output. The device provides a magnetic field that is sensitive to the proximity of either ferrous or permanent magnet materials. Further, the device provides a method to balance the magnetic field locally where the field sensor exists. The device overcomes the shortcomings of the prior art by providing an adjustable proximity sensing device.

A wide range of applications exist for tunable magnetic devices which employ magnetic field sensors, including position monitoring, proximity sensing, and counting applications.

The present invention, in one form thereof, comprises a tunable magnetic device. A permanent magnet in the shape of a ring or block is provided with an inner aperture. A magnetic field sensor is located above the inner aperture and is attached to the permanent magnet. A ferrous tuning device is located within the inner aperture and beneath the field sensor. The permanent magnet provides a bias magnetic field. The ferrous tuning device provides a magnetic field in opposition to the field produced by the permanent magnet. In essence, the ferrous tuning device provides a deductive magnetic field with respect to the field provided by the permanent magnet. The ferrous tuning device is movable relative to the permanent magnet and the field sensor. Adjustment of the location of the ferrous tuning device affects the magnetic field to which the field sensor is exposed. By adjusting the location of the ferrous tuning device, a desired bias field level can be obtained. This field adjustment can trim the field sensor for a number of functions or application requirements.

The present invention, in another form thereof, comprises a tunable magnetic device. A permanent magnet in the shape of a ring is axially magnetized to bias the magnetic sensor. An inner magnet located concentrically within the permanent magnet is axially magnetized in the direction opposite of the permanent magnet, thereby acting as a deductive magnet with respect to the field of the permanent magnet. A magnetic field sensor is located above the inner magnet and is attached to the permanent magnet. The inner magnet is movable relative to the permanent magnet and the field sensor. Adjustment of the location of the inner magnet affects the magnetic field to which the field sensor is exposed.

The present invention, in still another form thereof, comprises a device having a tunable magnetic circuit that is made up of a ring-shaped permanent magnet which is axially magnetized to bias a magnetic sensor. An inner magnet is located concentrically within the permanent magnet. The inner magnet is axially magnetized in a direction opposite of the outer ring magnet. A field sensor is located above the inner magnet. The inner magnet can be adjusted in magnetic potential by the use of an external field. This external field can be used to either raise or lower the magnetic potential of the inner magnet so that the complete magnetic circuit is tuned for proper performance.

The invention, in yet another form thereof, comprises a device having a tunable magnetic circuit that is made up of a single permanent magnet which is magnetized with concentric poles. The inner magnetic pole is located concentrically within the permanent magnet. The inner magnetic pole magnetized in a direction opposite of the outer ring magnet. A field sensor is located above the inner magnetic pole. The inner magnet can be adjusted in magnetic potential by the use of an external field. This external field can be used to either raise or lower the magnetic potential of the inner magnetic pole so that the complete magnetic circuit is tuned for proper performance.

In operation, a ferrous object brought in proximity to the tunable device will have the greatest influence on the outer permanent magnet and thereby imbalance the tuned magnetic field. This imbalance is measured by the magnetic field sensor. Besides ferrous objects, permanent magnet objects will also imbalance the tuned magnetic field as measured by the magnetic field sensor.

An advantage of a proximity sensing device according to the present invention is the simplicity of construction.

Another advantage of the present invention is the provision of a tuning mechanism which permits adjustment after device assembly.

A further advantage of the present invention is that outreach of the magnetic flux is greater thereby providing less critical spacing of the ferrous object to be sensed.

Another advantage of the present invention is the efficient detection of ferrous and permanent magnet objects.

Yet another advantage of the present invention is the ability to null out application magnetic fields where necessary.

A still further advantage of the present invention is the ability to trim the field sensor for a particular duty cycle.

Another advantage of the present invention is the ability to adjust for device offset requirements.

Yet a further advantage of the present invention is the ability to trim the field sensor for a specific operation when a target is at a desired position.

BRIEF DESCRIPTION OF THE DRAWINGS

The above-mentioned and other features and advantages of this invention, and the manner of attaining them, will become more apparent and the invention itself will be better understood by reference to the following description of an embodiment of the invention taken in conjunction with the accompanying drawings, wherein:

FIG. 1 is a cross-sectional view of a prior art magnetic device.

FIG. 2 shows the device of FIG. 1 with magnetic field lines.

FIG. 3 is a cross-sectional view of a tunable magnetic device with a ferrous tuning device.

FIG. 4 shows the device of FIG. 3 with magnetic field lines.

FIG. 5 is a cross-sectional view of a tunable magnetic device with an inner magnet and a pole piece.

FIG. 7 is a cross-sectional view of a tunable magnetic device with an inner magnet but without a pole piece.

FIG. 8 shows the device of FIG. 7 with magnetic field lines.

FIG. 11 is a cross-sectional view of a tunable magnetic device with a non-magnetic insert and a magnetic tip.

FIG. 12 is a cross-sectional view of a tunable magnetic device with a non-magnetic insert and a ferrous tip.

FIG. 13 is a cross-sectional view of a tunable magnetic device with a single disc of permanent magnet material which has concentric poles.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 6:
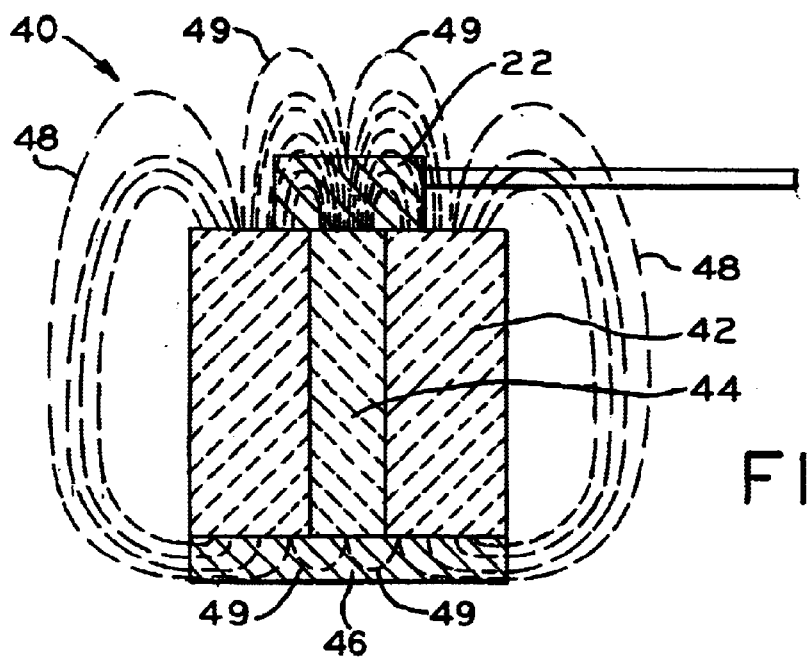
FIG. 6 shows the device of FIG. 5 with magnetic field lines.

Referring now to the drawings and particularly to FIG. 1, there is shown a cross-sectional view of prior art magnetic device 200. Device 200 includes a permanent magnet 204 in the shape of a ring, ferrous insert 208, air gaps 206, first pole piece 212, second pole piece 214 and magnetic field Hall effect sensor 202 secured to permanent magnet 204. First pole piece 212 has an aperture 205 therein. Ferrous insert 208 has a tapered end 207 which is aligned with aperture 205. Permanent magnet 204 provides a magnetic field which is imposed on field sensor 202. Ferrous insert 208 provides a magnetic field which has an opposite orientation to the magnetic field provided by permanent magnet 204. A ferrous object brought in close proximity to device 200 will have the greatest influence on permanent magnet 204 and thereby imbalance the magnetic field of device 200 accordingly. This imbalance will change the magnetic field measured by field sensor 202, which will provide an output, thereby indicating a ferrous object is present. Field sensor 202 produces a voltage output which is supplied to a transistor (not shown) for further signal processing. When the ferrous object is removed from the proximity of device 200, device 200 returns to its originally calibrated off position.

One drawback of prior art magnetic device 200 is that ferrous insert 208 must be calibrated before assembly to promote the most efficient operation of device 200. Furthermore, magnetic field lines 210 and 211, shown in FIG. 2, illustrate the limiting behavior imposed on device 200 by first pole piece 212 and second pole piece 214. By including both pole pieces in device 200, magnetic field lines 210 and 211 do not reach very far above pole piece 212. The lack of magnetic field outreach decreases the efficiency of device 200 in many applications and forces the distance from field sensor 202 to a ferrous object to be extremely small, thereby decreasing the effectiveness of device 200.

FIG. 3 is a cross-sectional view of tunable magnetic device 20 according to the present invention. Device 20 includes a permanent magnet 24 in the shape of a ring, inner aperture 26, ferrous tuning device 28, and Hall effect field sensor 22 bonded to permanent magnet 24. Permanent magnet 24 provides a magnetic field which is imposed on field sensor 22. Ferrous tuning device 28 provides a magnetic field which has an orientation opposite of the field provided by permanent magnet 24. Ferrous tuning device 28 is movably adjustable relative to permanent magnet 24 and field sensor 22. Adjustment of device 28 affects the magnetic field to which field sensor 22 is exposed. Ferrous tuning device 28 may be a screw or any other tunable device which may be adjusted by turning head 29 in the desired direction. By adjusting ferrous tuning device 28, the amount of the nulling field produced by ferrous tuning device 28 can be calibrated to just unlatch, or turn off, field sensor 22. Ferrous tuning device 28 permits the trimming of device 20 for a number of functions or application requirements. When a ferrous object which is to be sensed is brought in close proximity to tunable device 20, it will have the greatest influence on permanent magnet 24 and will unbalance the magnetic field of tunable device 20 accordingly. This imbalance will change the magnetic field measured by field sensor 22 thereby indicating that a ferrous object is present. Field sensor 22 produces a voltage output which is supplied to a transistor (not shown) for further signal processing. When the ferrous object is removed from the proximity of tunable device 20, device 20 returns to its originally calibrated off position.

In further reference to FIG. 3, permanent magnet 24 may be made of any permanent magnet material. A shorting path exists through inner aperture 26 and thus is very short. Inner aperture 26 and ferrous tuning device 28 are preferably very small. Device 20 becomes more efficient as the cross-sectional size of inner aperture 26 and ferrous tuning device 28 are decreased. While field sensor 22 is shown as a Hall effect sensor, other sensors could be used such as a magneto-restrictive device, a reed switch, a variable reluctance device, or any other sensor device which is responsive to magnetic flux.

FIG. 4 is a cross-sectional view of the tunable magnetic device 20 of FIG. 3 with magnetic field lines 30 and 31 shown. Field lines 30 and 31 illustrate the range of the magnetic field produced by device 20 as described above. In device 20, a highly oriented magnetic flux density and a high magneto motive force (MMF) material allow the magnetic field to reach far above field sensor 22 thereby allowing efficient detection of a ferrous object. Field lines 30 and 31 represent deductive magnetic fields since they are oriented in opposite directions. For instance, field lines 30 may travel from the top to the bottom of device 20 while field lines 31 may travel from the bottom to the top of device 20. Thus, ferrous tuning device 28 can be adjusted to maintain a nulling field to just unlatch field sensor 22. In this way, ferrous tuning device 28 permits the calibration of tunable magnetic device 20. Field lines 30 and 31 extend further above field sensor 22 than in prior art embodiments, thereby allowing more efficient detection of ferrous objects near field sensor 22 and providing less critical spacing of the ferrous object to be sensed from sensor 22.

FIG. 5 is a cross-sectional view of a different embodiment of a tunable magnetic device in accordance with the present invention. Device 40 includes permanent magnet 42 in the shape of a ring, inner magnet 44, pole piece 46, and field sensor 22 secured to permanent magnet 42 as by bonding. Pole piece 46 permits field lines 48 and 49, shown in FIG. 6, to extend further above field sensor 22 because pole piece 46 acts as a conductor for magnetic field lines 48 and 49. Since pole piece 46 is a better conductor than air, field lines 48 and 49 encounter less resistance at the end of device 40 opposite to field sensor 22. The resultant field therefore extends further upward from field sensor 22. Due to the presence of pole piece 46, field lines 48 and 49 do not extend very far below pole piece 46 and thereby add to the magnetic field outreach above field sensor 22. Permanent magnet 42 is axially magnetized to bias field sensor 22 either in a high or a low state depending on the application needs. Inner magnet 44 is located in the center of magnet 42 and is axially magnetized in the opposite direction of magnet 42. Inner magnet 44 provides a magnetic field local to field sensor 22 and forms a close or line fit with magnet 42. Field sensor 22 is located above inner magnet 44 and is secured to permanent magnet 42. Inner magnet 44 is tuned to just unlatch field sensor 22. A ferrous object brought in proximity to device 40 will have the greatest influence on permanent magnet 42 and thereby imbalance the magnetic field of device 40 accordingly. This imbalance will change the field measured by field sensor 22. Field sensor 22 will then provide an output voltage to a separate transistor (not shown) for further signal processing, thereby indicating that a ferrous object is present.

Further referring to FIG. 5, a tuning mechanism is included to optimize the performance of device 40 after assembly of random components. The tuning mechanism could be to vary the magnetization level of either permanent magnet 42 or inner magnet 44. The optimum choice for the intended application is to independently magnetize permanent magnet 42 and inner magnet 44 to their saturation levels and assemble them with field sensor 22. Increasing demagnetization pulses would then be applied to device 40 to lower the magnetization level of inner magnet 44 until field sensor 22 changes state or obtains the desired duty cycle under interrogation. Essentially, device 40 is magnetically calibrated, or tuned, without changing the magnetic properties of permanent magnet 42.

FIG. 7 is a cross-sectional view of tunable magnetic device 40 but without a pole piece 46. Without a pole piece, magnetic field lines 50 and 51, shown in FIG. 8, of device 40 do not extend out as far above field sensor 22 with respect to the situation where a pole piece is present. Without a pole piece, field lines 50 and 51 must travel through air below device 40 and therefore encounter more resistance than if a pole piece were present. The resistance prohibits field lines 50 and 51 from reaching as far above field sensor 22 as field lines 48 and 49, shown in FIG. 6.

Figure 9:
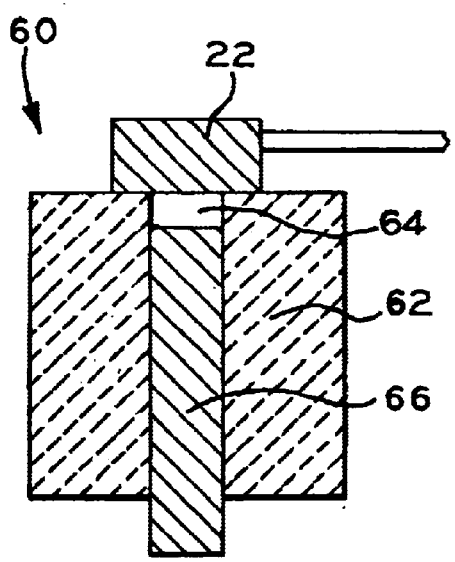
FIG. 9 is a cross-sectional view of a tunable magnetic device with a ferrous insert.

FIG. 9 is a cross-sectional view of tunable magnetic device 60. Device 60 is an alternative embodiment of the present invention and includes permanent magnet 62 in the shape of a ring, inner aperture 64, ferrous tuning device 66, and field sensor 22 secured to permanent magnet 62. In operation, tunable magnetic device 60 functions identically to tunable magnetic device 20, shown in FIGS. 3 and 4. Device 60 is different, however, with respect to the method of calibration. Ferrous tuning device 66 is adjusted within inner aperture 64 to calibrate device 60 by moving device 66 into or out of aperture 64 until field sensor 22 is just unlatched. Preferably, ferrous tuning device 66 forms a close or line fit with permanent magnet 62. The efficiency of device 60 increases as the tightness of the fit between ferrous tuning device 66 and permanent magnet 62 increases since there will be little or no air gap between device 66 and magnet 62.

Figure 10:
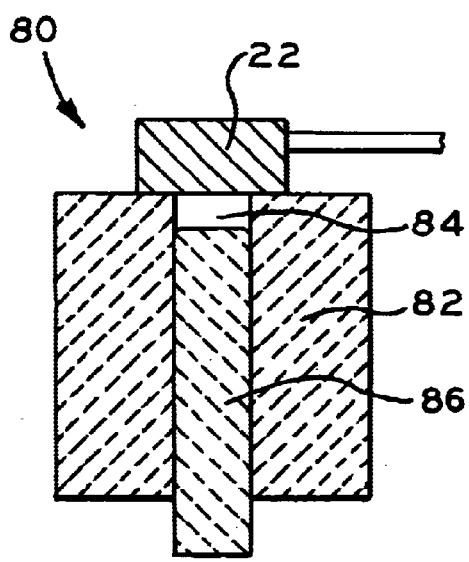
FIG. 10 is a cross-sectional view of a tunable magnetic device with a magnetic insert.

FIG. 10 is a cross-sectional view of tunable magnetic device 80. Device 80 is an alternative embodiment of the present invention and includes permanent magnet 82 in the shape of a ring, inner aperture 84, magnetic tuning device 86, and field sensor 22 bonded to permanent magnet 82. In operation, tunable magnetic device 80 functions similarly to tunable magnetic device 20, shown in FIGS. 3 and 4. Device 80 is different, however, with respect to the method of calibration. Magnetic tuning device 86 is adjusted within inner aperture 84 to calibrate device 80 by moving device 86 into or out of aperture 84 until field sensor 22 is just unlatched. Preferably, magnetic tuning device 86 forms a close or line fit with permanent magnet 82. The efficiency of device 80 increases as the tightness of the fit between magnetic tuning device 86 and permanent magnet 82 increases.

FIG. 11 is a cross-sectional view of tunable magnetic device 100. Device 100 is an alternative embodiment of the present invention and includes permanent magnet 102 in the shape of a ring, inner aperture 104, non-magnetic tuning device 106, magnetic tip 108, and field sensor 22 bonded to permanent magnet 102. Magnetic tip 108 is secured to non-magnetic tuning device 106. In operation, device 100 functions similarly to device 80, shown in FIG. 10. Non-magnetic tuning device 106 may be adjusted within aperture 104 to just unlatch field sensor 22. Preferably, magnetic tip 108 and non-magnetic tuning device 106 form a close or line fit with permanent magnet 102 to increase the efficiency of device 100. Non-magnetic tuning device 106 could be threaded for a screw-type adjustment operation, if desired, to aid in the adjustment of the location of magnetic tip 108.

FIG. 12 is a cross-sectional view of tunable magnetic device 120. Device 120 is an alternative embodiment of the present invention and includes permanent magnet 122 in the shape of a ring, inner aperture 124, non-magnetic tuning device 126, ferrous tip 128, and field sensor 22 secured to permanent magnet 122. Ferrous tip 128 is bonded to non-magnetic tuning device 126. In operation, device 120 functions similarly to device 60, shown in FIG. 9. Preferably, ferrous tip 128 and non-magnetic tuning device 126 form a line fit with permanent magnet 122 to increase the efficiency of device 120. Non-magnetic tuning device 126 could be threaded to make a screw-type operation, if desired, to aid in the adjustment of the location of ferrous tip 128.

FIG. 13 is a cross-sectional view of tunable magnetic device 140. Device 140 is constructed of single disc of permanent magnet material 142 which is magnetized with concentric poles. A ferrous pole piece similar to pole piece 46 in FIG. 5 can be added if desired to enhance the performance of magnetic device 140. Tuning can be achieved by varying the magnetization level of magnet 142. Magnetic flux lines 150 and 151 are also shown.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A tunable magnetic device comprising:

a magnet structure comprising a permanent magnet and a ferrous tuning element physically connected with and movable relative to said magnet to tune said magnetic device, said magnet structure lacking pole pieces; and a magnetic field sensor secured to said magnet structure in proximity to said ferrous tuning element.

2. The device according to claim 1 wherein said ferrous tuning element forms a line fit with said permanent magnet.

3. The device according to claim 1 wherein said ferrous tuning element comprises a ferrous tuning element which is directly threaded into said permanent magnet.

4. The device according to claim 1 wherein said ferrous tuning element is bonded to a non-magnetic tuning element.

5. The device according to claim 4 wherein said non-magnetic tuning element is threadedly associated with said permanent magnet.

6. The device according to claim 1 wherein said permanent magnet is ring-shaped.

7. The device according to claim 1 wherein said ferrous tuning element is located within said permanent magnet.

8. The device according to claim 1 wherein said ferrous tuning element is magnetized in a direction opposite to the direction of magnetization of said permanent magnet.

* * * * *